(12) United States Patent
Brown

(10) Patent No.: US 11,935,613 B2
(45) Date of Patent: Mar. 19, 2024

(54) METHOD FOR TUNING AN EXTERNAL MEMORY INTERFACE

(71) Applicant: TEXAS INSTRUMENTS INCORPORATED, Dallas, TX (US)

(72) Inventor: Zachary John Brown, Sugar Land, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 17/390,807

(22) Filed: Jul. 30, 2021

(65) Prior Publication Data

US 2022/0043760 A1 Feb. 10, 2022

Related U.S. Application Data

(60) Provisional application No. 63/061,333, filed on Aug. 5, 2020.

(51) Int. Cl.
*G11C 29/50* (2006.01)
*G06F 13/16* (2006.01)
*G06F 13/42* (2006.01)
*G11C 16/32* (2006.01)
*G11C 29/12* (2006.01)
*G11C 29/38* (2006.01)

(52) U.S. Cl.
CPC .... *G11C 29/50012* (2013.01); *G06F 13/1668* (2013.01); *G06F 13/4282* (2013.01); *G11C 16/32* (2013.01); *G11C 29/12015* (2013.01); *G11C 29/38* (2013.01)

(58) Field of Classification Search
CPC . G06F 13/1668; G06F 13/4282; G11C 16/32; G11C 29/12015; G11C 29/38; G11C 29/023; G11C 29/028; G11C 29/50012; G11C 16/26; G11C 7/04; G01R 31/3161; G01R 31/3173
See application file for complete search history.

(56) References Cited

U.S. PATENT DOCUMENTS

| | | | |
|---|---|---|---|
| 8,977,998 B1 * | 3/2015 | Azizi | G06F 30/3312 |
| | | | 716/108 |
| 10,032,502 B1 * | 7/2018 | Gopalan | G11C 11/4093 |
| 2005/0114725 A1 * | 5/2005 | Patel | G01R 35/005 |
| | | | 713/500 |
| 2006/0003715 A1 * | 1/2006 | Partsch | G11C 29/50012 |
| | | | 455/127.1 |

(Continued)

*Primary Examiner* — Steve N Nguyen
(74) *Attorney, Agent, or Firm* — Brian D. Graham; Frank D. Cimino

(57) ABSTRACT

A device and method are presented. Largest and smallest successful values of a receive clock delay and a transmit clock delay are determined. A first set of parameters for an SPI coupled to a DDR flash memory are set, including the largest successful values of the transmit clock delay and the receive clock delay, and a first value of a RD cycle. A second set of parameters for the SPI are set, including the smallest successful value of the transmit clock delay and receive clock delay, and a second value of the RD cycle. One of the first and second sets of parameters is selected based on whether the first or second set of parameters results in successfully reading from the DDR flash memory over a larger range of operating temperatures. The SPI is programmed using the selected one of the first and second sets of parameters.

20 Claims, 8 Drawing Sheets

(56) References Cited

U.S. PATENT DOCUMENTS

| | | | |
|---|---|---|---|
| 2006/0156045 A1* | 7/2006 | Galles | G06F 1/3203 |
| | | | 713/300 |
| 2006/0238230 A1* | 10/2006 | Patel | G11C 7/222 |
| | | | 327/261 |
| 2008/0123444 A1* | 5/2008 | Patel | G11C 7/22 |
| | | | 365/194 |
| 2009/0241080 A1* | 9/2009 | Yang | G06F 30/3312 |
| | | | 716/113 |
| 2013/0151751 A1* | 6/2013 | Widmer | G11C 5/02 |
| | | | 711/E12.008 |
| 2018/0033477 A1* | 2/2018 | Gopalan | G06F 12/0646 |

* cited by examiner

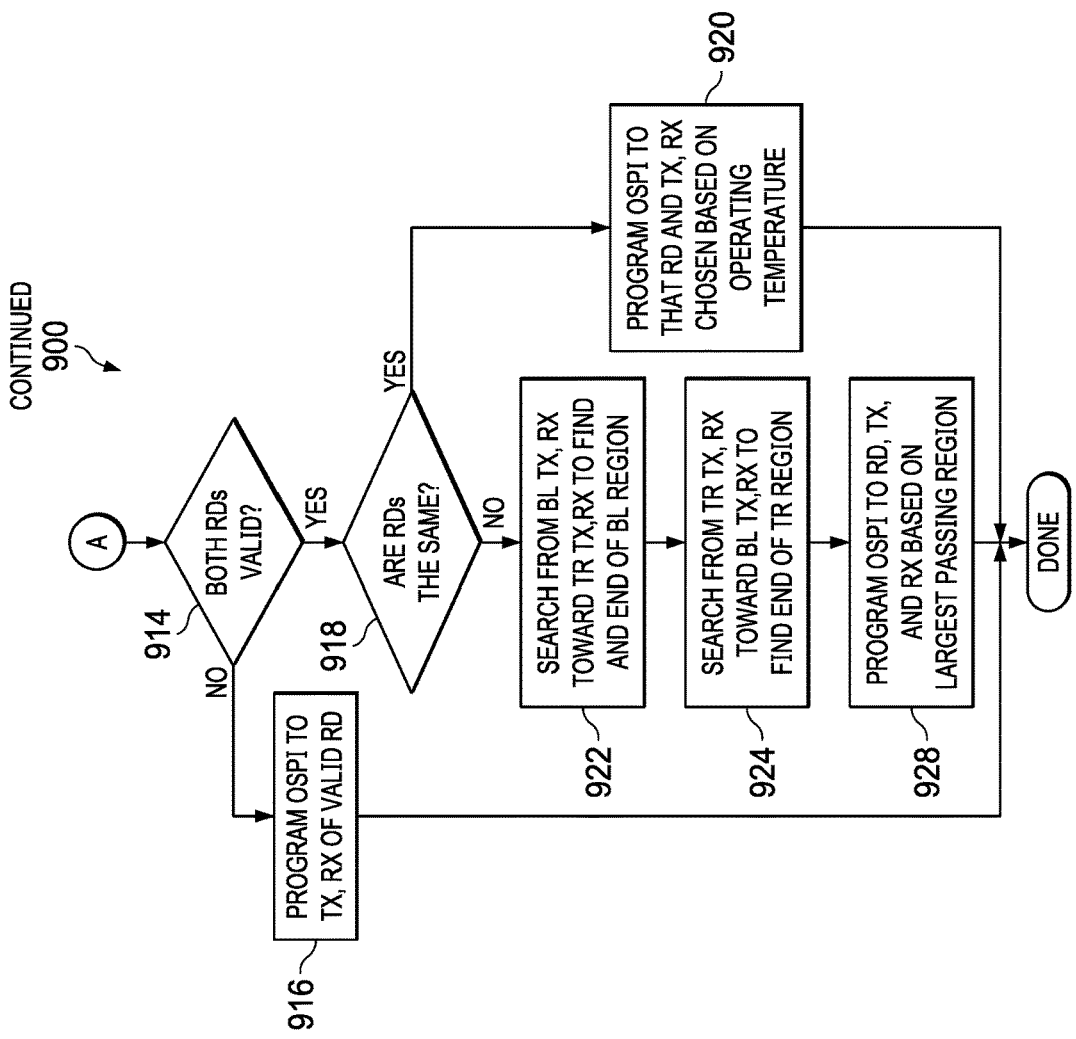
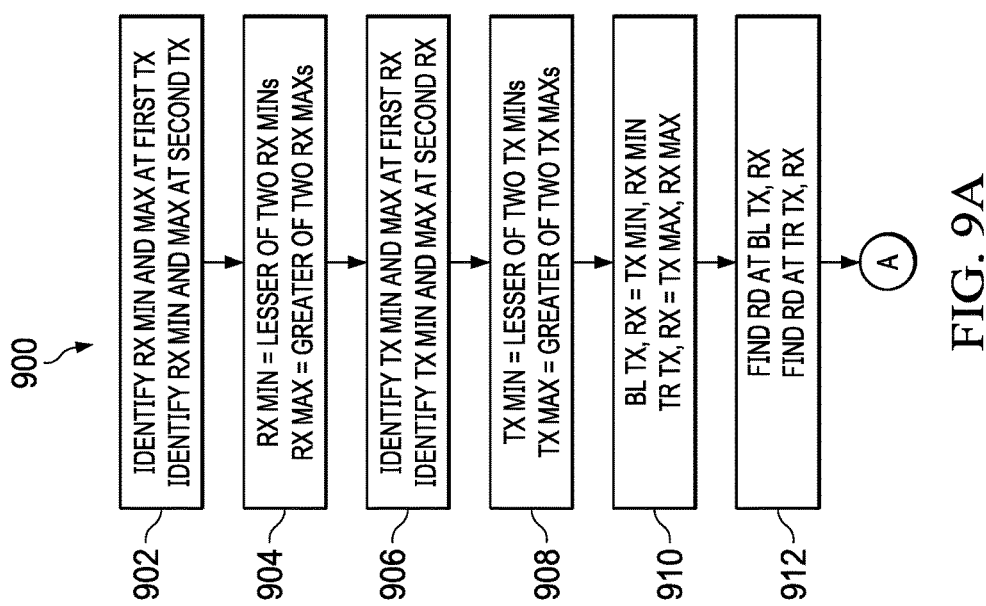
FIG. 9B
FIG. 9A

METHOD FOR TUNING AN EXTERNAL MEMORY INTERFACE

CROSS-REFERENCE TO RELATED APPLICATIONS

The present application claims priority to U.S. Provisional Patent Application No. 63/061,333, which was filed Aug. 5, 2020, is titled "An Approach to Tuning an External Memory Interface in The Fewest Steps," and is hereby incorporated herein by reference in its entirety.

BACKGROUND

A System on a Chip (SoC) is an integrated circuit that includes components of an electronic system. These components may include on a single substrate or microchip a microcontroller, microprocessor, or one or more processor cores; static and dynamic memory; coprocessor circuits such as security circuits and graphics processing units (GPUs); serial and parallel input/output ports; and ethernet, Wi-Fi, and cellular communication interfaces. An SoC may be coupled to external devices by the serial and/or parallel input/output ports or by the ethernet, Wi-Fi, and/or cellular communication interfaces.

SUMMARY

In examples, a device includes a memory storing instructions and a processor adapted to be coupled to a DDR flash memory by way of an SPI. The processor is configured to execute the instructions stored in the memory to determine a first set of parameters for the SPI that is usable by the processor to read successfully from the DDR flash memory, the first set of parameters comprising a largest successful value of a transmit clock delay, a largest successful value of a receive clock delay, and a first value of a reference clock delay (RD) cycle. The processor is also configured to execute the instructions stored in the memory to determine a second set of parameters for the SPI that is usable by the processor to read successfully from the DDR flash memory, the second set of parameters comprising a smallest successful value of the transmit clock delay, a smallest successful value of the receive clock delay, and a second value of the RD cycle. The processor is further configured to execute the instructions stored in the memory to select one of the first and second sets of parameters based on a determination of whether the first set of parameters is usable by the processor to read successfully from the DDR flash memory over a larger range of operating temperatures of the device than the second set of parameters. The processor is still further configured to execute the instructions stored in the memory to program the SPI using the selected one of the first and second sets of parameters.

In another example, a device includes a memory storing instructions and a processor adapted to be coupled to a DDR flash memory by way of an SPI. The processor is configured to execute the instructions stored in the memory to determine final largest and smallest successful values of a receive clock delay by determining first largest and smallest successful values of a receive clock delay at a first value of a transmit clock delay and determining second largest and smallest successful values of the receive clock delay at a second value of the transmit clock delay; and setting the final largest successful value of the receive clock delay to a larger of the first and second largest values of the receive clock delay and setting the final smallest successful value of the receive clock delay to a smaller of the first and second smallest values of the receive clock delay. The processor is also configured to execute the instructions stored in the memory to determine final largest and smallest successful values of the transmit clock delay by determining first largest and smallest successful values of the transmit clock delay at a first value of the receive clock delay and determining second largest and smallest successful values of the transmit clock delay at a second value of the receive clock delay; and setting the final largest successful value of the transmit clock delay to a larger of the first and second largest values of the transmit clock delay and setting the final smallest successful value of the transmit clock delay to a smaller of the first and second smallest values of the transmit clock delay. The processor is further configured to execute the instructions stored in the memory to set a first set of parameters for the SPI, the first set of parameters comprising the final largest value of the transmit clock delay, the final largest successful value of the receive clock delay, and a first value of a RD cycle; and set a second set of parameters for the SPI, the second set of parameters comprising the final smallest value of the transmit clock delay, the final smallest successful value of the receive clock delay, and a second value of the RD cycle. The processor is further configured to execute the instructions stored in the memory to select one of the first and second sets of parameters based on a determination of whether the first set of parameters is usable by the processor to read successfully from the DDR flash memory over a larger range of operating temperatures of the device than the second set of parameters; and program the SPI using the selected one of the first and second sets of parameters.

In a further example, a method includes determining largest and smallest successful values of a receive clock delay and determining largest and smallest successful values of a transmit clock delay. The method also includes setting a first set of parameters for an SPI coupled to a DDR flash memory, the first set of parameters comprising the largest successful value of the transmit clock delay, the largest successful value of the receive clock delay, and a first value of a RD cycle. The method further includes setting a second set of parameters for the SPI, the second set of parameters comprising the smallest successful value of the transmit clock delay, the smallest successful value of the receive clock delay, and a second value of the RD cycle. The method still further includes selecting one of the first and second sets of parameters based on determining whether the first set of parameters results in successfully reading from the DDR flash memory over a larger range of operating temperatures of a device performing the method than the second set of parameters. The method also includes programming the SPI using the selected one of the first and second sets of parameters.

BRIEF DESCRIPTION OF THE DRAWINGS

For a detailed description of various examples, reference will now be made to the accompanying drawings in which:

FIGS. 9A and 9B show a flow chart of a first method for selecting a preferred tuning point for an SPI in accordance with various examples;

DETAILED DESCRIPTION

Figure 1:
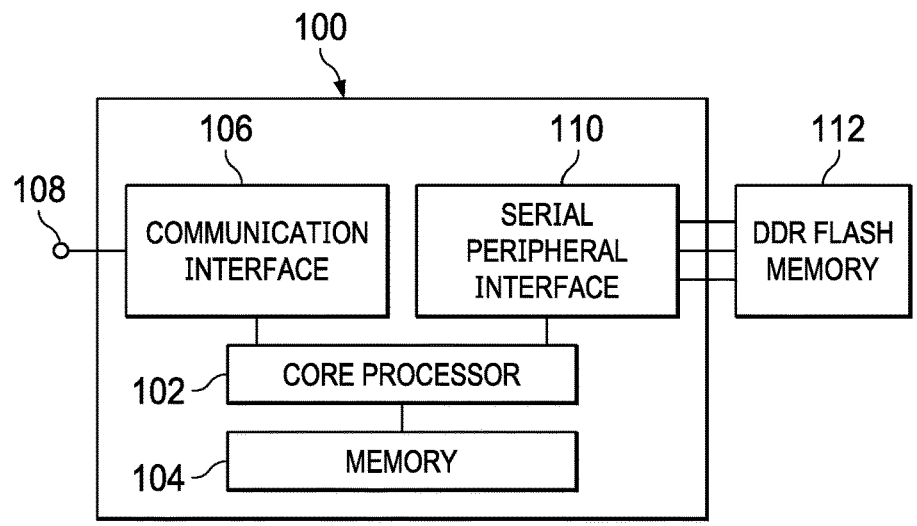
FIG. 1 is a block diagram of an SoC coupled to a Double Data Rate (DDR) flash memory in accordance with various examples.

A SoC may include an SPI that electrically couples the SoC to a DDR flash memory device. The SPI may be an Octal SPI (OSPI), a Quad SPI (QSPI), or other SPI suitable for coupling the SoC to the DDR flash memory. Timing parameters of the SPI that control program and read transactions with the DDR flash device are referred to as tuning point parameters (or tuning points). They include TX, which is a transmit clock PDL delay, RX, which is a receive clock PDL delay, and RD cycle, which is a number of cycles to delay an SPI reference clock for reading data received by the SPI from the DDR flash device.

At different SoC die operating temperatures, some ranges of tuning points result in successful transactions between the SPI and the DDR flash device, while others do not. A successful tuning point allows the SPI to reliably program and read data to/from the DDR flash device. An unsuccessful tuning point causes the SPI to fail altogether or to unreliably program and read data to/from the DDR flash device. At different operating temperatures, the ranges of tuning points that are successful and unsuccessful also change. When an SoC is first coupled to a DDR flash device, a tuning point for the SPI is programmed and is not reprogrammed during subsequent operation of the SoC. As a result, as the SoC die operating temperature changes during operation, the originally programmed successful tuning point of the SPI may become an unsuccessful tuning point.

The tuning point selection method described herein selects an SPI tuning point for transactions with a DDR flash device during configuration that will successfully program and read to/from the DDR flash device over a wider range of SoC die operating temperatures than other successful tuning points. The method searches subsets of candidate tuning points to determine, if possible, a 'maximum' tuning point having largest transmit clock PDL delay and receive clock PDL delay that successfully read data from the DDR flash device via the SPI (maximum successful TX and RX) and a 'minimum' tuning point having smallest transmit clock PDL delay and receive clock PDL delay that successfully read data from the DDR flash device via the SPI (minimum successful TX and RX).

A set of possible tuning points may be represented as a rectangle. The maximum and minimum tuning points form the top right and bottom left corners, respectively, of the rectangle of possible tuning points. A band of unsuccessful tuning points may exist between the top right and bottom left corners of the rectangle, indicating that the RD cycle value for the top right corner is different than the RD cycle value for the bottom left corner. Such a band separates the rectangle into a first region of successful tuning points having the same RD cycle as the maximum tuning point and a second region of successful tuning points having the same RD cycle as the minimum tuning point. The method searches the subset of tuning points located on a line between the maximum and minimum tuning points to find the boundaries of the band of unsuccessful tuning points, if any such band exists.

If boundaries of the band are found, the method determines whether the boundaries are closer to the maximum tuning point or the minimum tuning point. The tuning point that is farther from the boundaries is in the larger of the first and second regions and will result in successful programming and reading to/from the DDR flash device over a wider range of SoC die operating temperatures. If no boundaries of the band are found, a tuning point between the maximum and minimum tuning points is chosen based on an expected operating temperature of the SoC die.

Various examples are illustrated in the figures, like numerals being used to refer to like and corresponding parts of the various drawings.

FIG. 1 is a block diagram of an SoC 100 coupled to a DDR flash memory 112 in accordance with various examples. The SoC 100 includes a core processor 102 coupled to a memory 104. The memory 104 is configured to store instructions 105 that, when executed by the core processor 102, cause the core processor 102 to perform the various functionalities described herein. The memory 104 is one example of a non-transitory, computer-readable medium.

The core processor 102 is coupled via a communication interface 106 to one or more communication links 108 to facilitate communication with other devices. The core processor 102 is further coupled via an SPI 110 to the DDR flash memory 120. The SoC 100 includes other circuits and processors that are not shown in FIG. 1 to simplify explanation of the tuning point selection method described herein.

Figure 2:
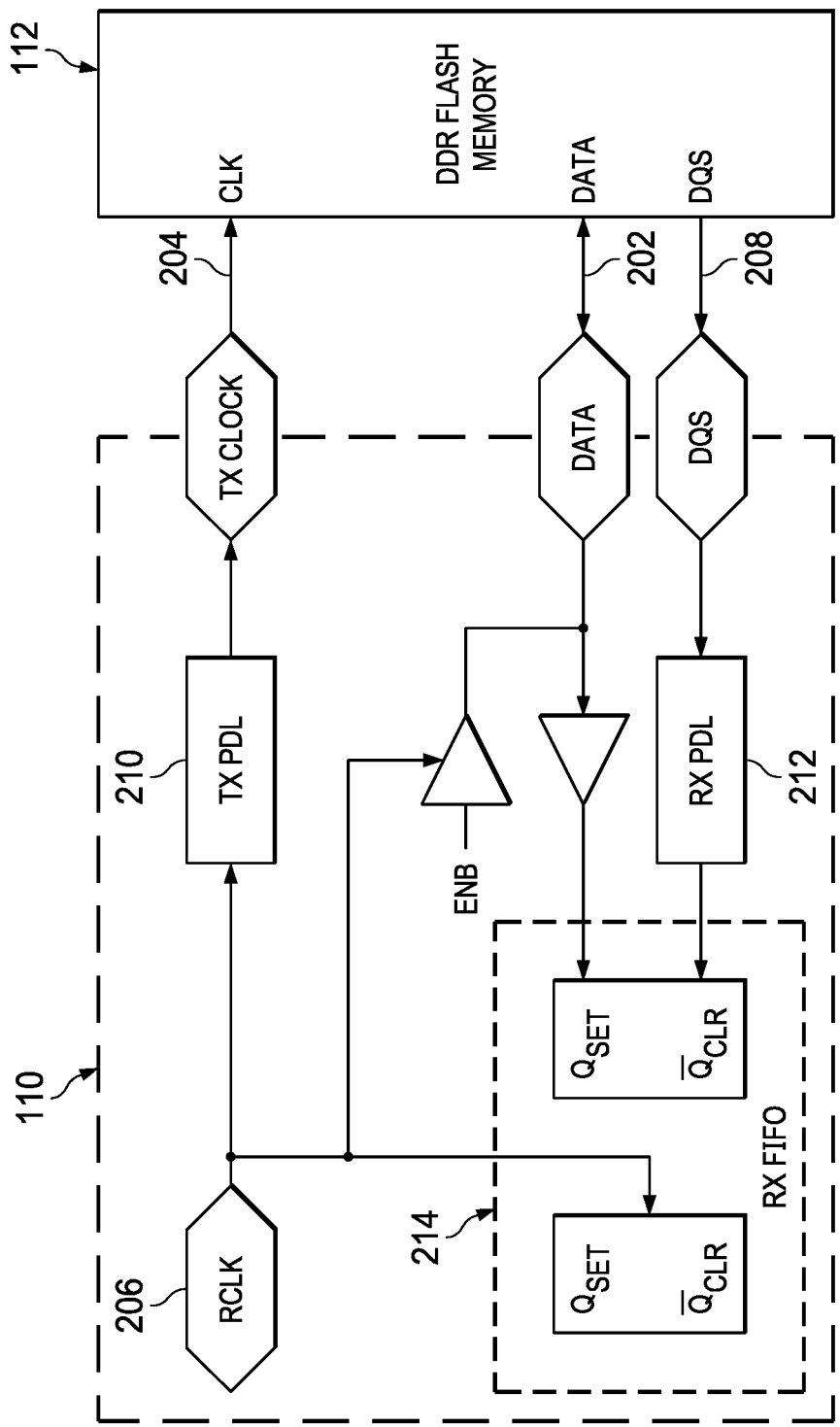
FIG. 2 is a block diagram of a Serial Peripheral Interface (SPI) in accordance with various examples.

FIG. 2 is a block diagram of the SPI 110 in accordance with various examples. The SPI 110 is coupled to the DDR flash memory 120 by data lines 202, an SPI clock line 204, and a data strobe (DQS) line 208. The data lines 202 are bidirectional, allowing each of the SPI 110 and the DDR flash memory 120 to send data to the other in different phases of a transaction. In examples, the SPI 110 is an OSPI. The DDR flash memory 120 uses the SPI clock line 204 to capture command and address information from the data lines 202 during command and address phases of a transaction. The DDR flash memory 120 also uses the SPI clock line 204 to capture data from the data lines 202 during a data phase of a program transaction. The SPI 110 uses a delayed copy of the DQS line 208 to capture data from the data lines 202 during the data phase of a read transaction.

The SPI 110 includes an internal reference clock 206 that is delayed by a TX PDL 210 to form the SPI clock line 204. The value of the TX PDL 210 delay is referred to as 'TX.' Edges of signal pulses on the DQS line 208 are aligned with data transitions on the data lines 202 from the DDR flash memory 120 during the data phase of a read transaction. The DQS line 208 is delayed by a RX PDL 212 to cause a received first-in-first out (FIFO) shift register to sample data on the data lines 202 after the values have settled. The value of the RX PDL 212 delay is referred to as A 'round trip delay' of data may be defined as the time from a reference clock 206 edge to a sampling time in the SPI 110 of data from the DDR flash memory 120 that is triggered by that edge. The TX PDL 210 delay, a travel time of the clock over the SPI clock line 204, an output delay of the DDR flash memory 120, and the RX PDL 212 delay, create the round trip delay. As described above, the SPI 110 samples the data lines 202 into the RX FIFO 214 using the DQS line 208 as delayed by the RX PDL 212. The data is read by the SPI 110 out of the RX FIFO 214 using the reference clock 206.

The SPI 110 expects the first byte of data to be captured within a specific cycle of the reference clock 206 (the target cycle or RD cycle), and all remaining data to be captured in succeeding cycles of the reference clock 206. In some cases, the round trip delay is longer than the period of the reference clock 206 and the target cycle is moved to a following cycle of the reference clock 206 to read data successfully on the data lines 202.

The goal of the tuning point selection method described herein is to select a preferred tuning point (values of TX, RX, and RD cycle) for the SPI 110 to use with the DDR flash memory 120.

Figure 3:
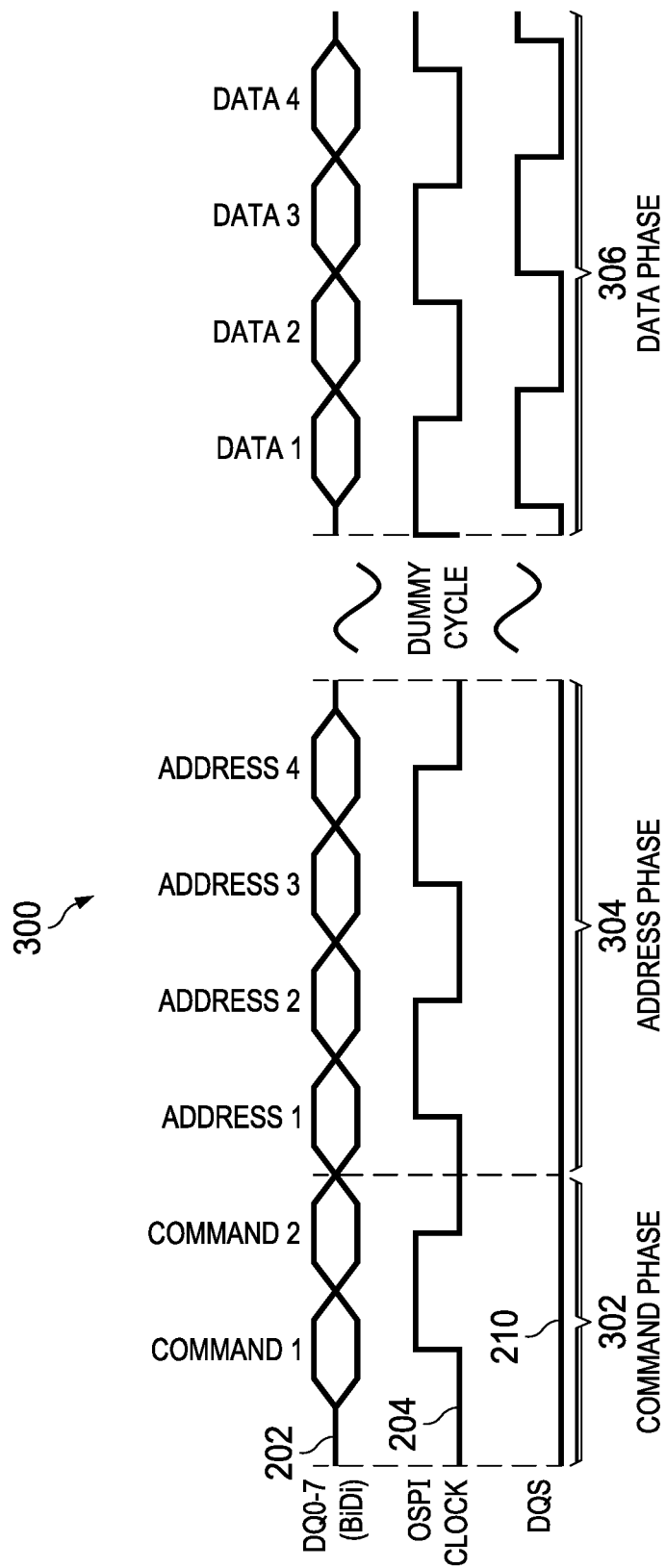
FIG. 3 shows a timing diagram of a read transaction in accordance with various examples.

FIG. 3 shows a timing diagram 300 of a read transaction performed by the SPI 110 of FIG. 2 in accordance with various examples. The read transaction comprises a command phase 302, an address phase 304, and a data phase 306. In the command phase 302, the SPI 110 sends command bytes on the data lines 202 and the reference clock 206 as delayed by TX PDL 210 on the SPI clock line 204. In the address phase 304, the SPI 110 sends address bytes on the data lines 202 and the reference clock 206 as delayed by TX PDL 210 on the SPI clock line 204. One or more dummy cycles are inserted after the address phase 204 to provide the DDR flash memory 120 time to access the addressed memory. In the command phase 302 and the address phase 304, the DDR flash memory 120 reads command bytes and address bytes, respectively from the data lines 202. In the data phase 306, the DDR flash memory 120 sends read data bytes on the data lines 202 and the DQS signal on the DQS line 208.

Figure 4:
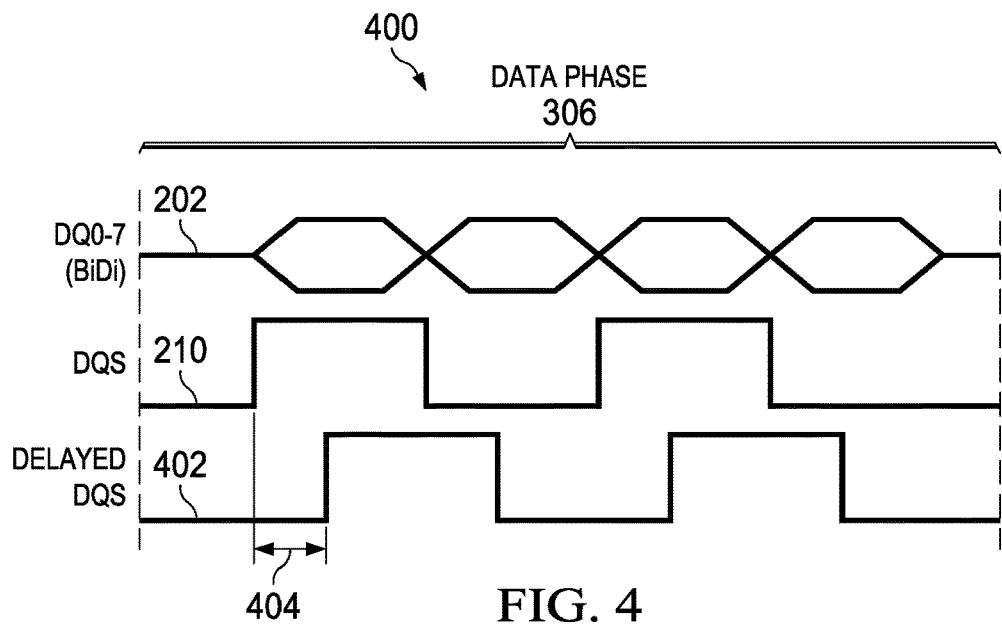
FIG. 4 shows a timing diagram of data sampling in a read transaction in accordance with various examples.

FIG. 4 shows a timing diagram 400 of data sampling in the SPI 110 during a read transaction in accordance with various examples. The read data bytes on the data lines 202 and the DQS signal on the DQS line 208 are as shown in FIG. 3. The delayed DQS signal 402 is the DQS line 208 as delayed by the value of the RX PDL 212 delay, RX 404.

Figure 5:
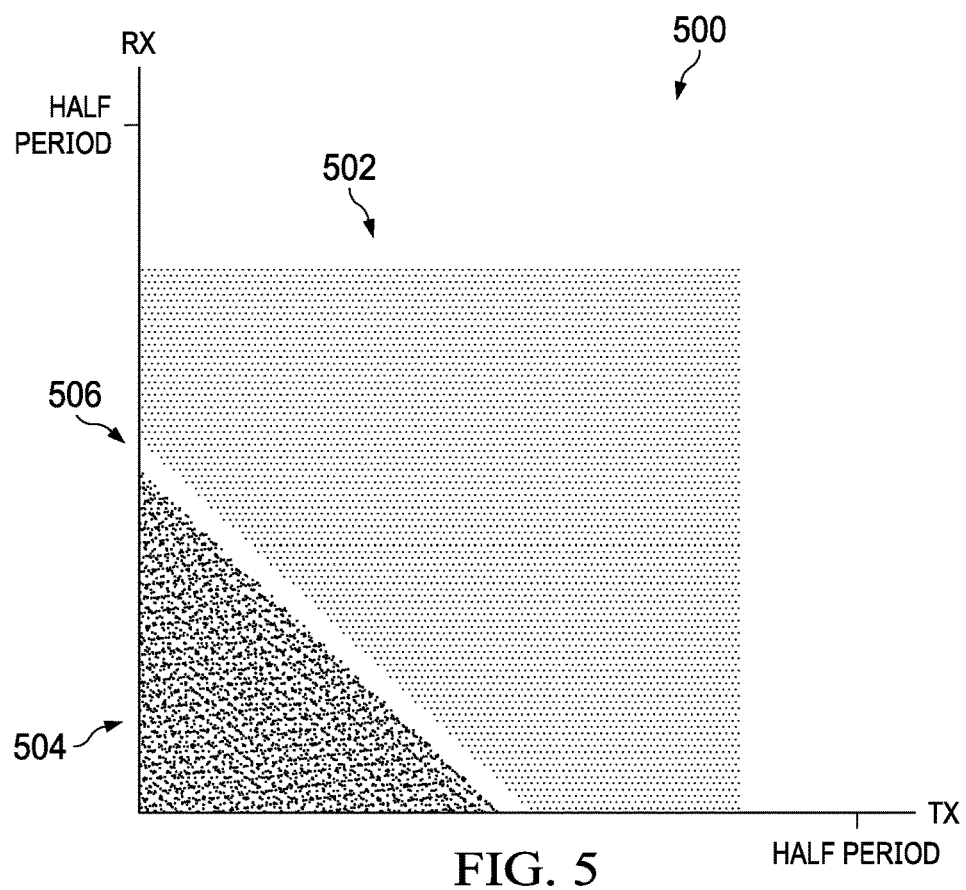
FIG. 5 shows a plot of transmit clock programmable delay line (PDL) delay (TX), receive clock PDL delay (RX), and SPI reference clock delay cycle (RD cycle) values for two regions of successful read transactions in accordance with various examples.

FIG. 5 shows a plot 500 of TX, RX, and RD values for two regions of successful read transactions (passing read transaction regions) in accordance with various examples. Combinations of TX and RX delay values can be viewed as a 2-dimensional plot, with TX delay on the horizontal axis, and RX delay on the vertical axis. The delay values are limited to half the period of delay provided by the transmit PDL and the receive PDL, because the DDR flash memory 120 is a double data rate flash memory, performing two data transfers per complete clock cycle. Plot 500 is a schematic plot showing combinations of TX, RX, and RD values that cause the SPI 110 to read successfully from the DDR flash memory 120. Regions 502 and 504 show TX and RX combinations for two different RD cycle values that result in successful reads from the DDR flash memory 120. Regions 502 and 504 may also be referred to as passing read regions. A read is characterized as successful when the data read from the DDR flash memory 120 is an exact match for data previously written to the DDR flash memory 120.

White space around the regions 502 and 504, as well as in the region 506, represents TX and RX combinations for which no RD cycle value results in matching data being read from the DDR flash memory 120. Accordingly, the white spaces in plot 500 may be referred to as failing read regions.

As described above, each of the passing read regions 502 and 504 corresponds to a different RD cycle value (or 'target cycle'). The tuning point selection method described herein identifies the largest region, selects the corresponding RD cycle value, and sets the TX and RX delay values to sample within that target cycle.

Minimum and maximum values of TX result from setup and hold time limitations of the SPI 110. TX delays outside this range cause command and address bytes to be latched incorrectly by the SPI 110, resulting in unsuccessful read transactions. Similarly, minimum and maximum values of RX result from setup and hold time limitations of the SPI 110. RX delays outside this range cause command and address bytes to be latched incorrectly by the SPI 110, resulting in unsuccessful read transactions. Both the TX and RX delay values contribute to the round trip delay, which pushes the sample point from one RD cycle value to the next. The failing read region 506 between regions 502 and 504 exists because, there is an upper limit for TX and RX delay values for which the SPI 110 can successfully sample the data lines 202 within the first cycle of the reference clock 206. For TX and RX values above that limit, the SPI 110 can successfully sample the data lines 202 within the second cycle of the reference clock 206.

Figure 6A:
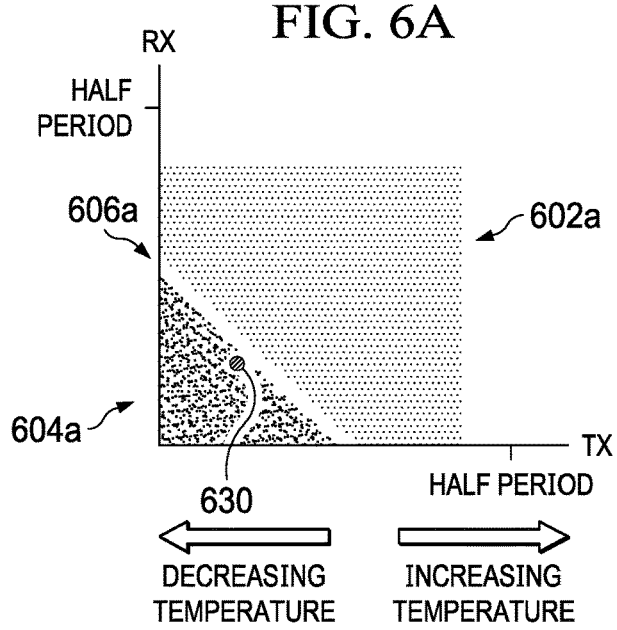
FIGS. 6A-6C show plots indicating the effect of SoC die operating temperature on passing and failing read transaction regions in accordance with various examples.
Figure 6B:
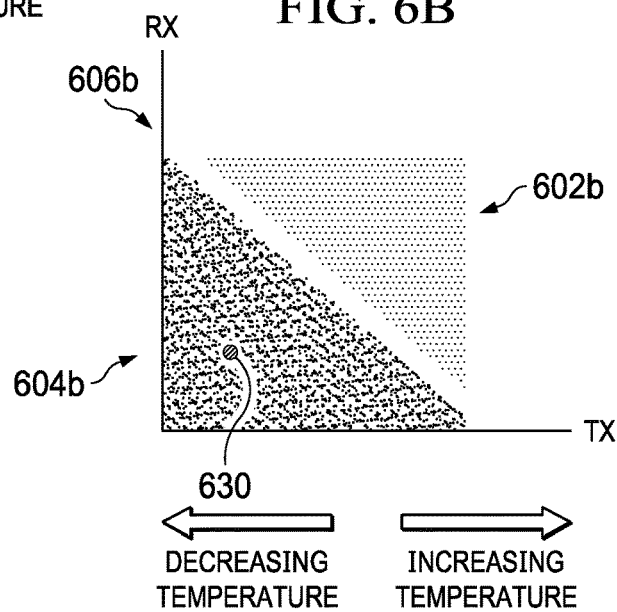
Figure 6C:
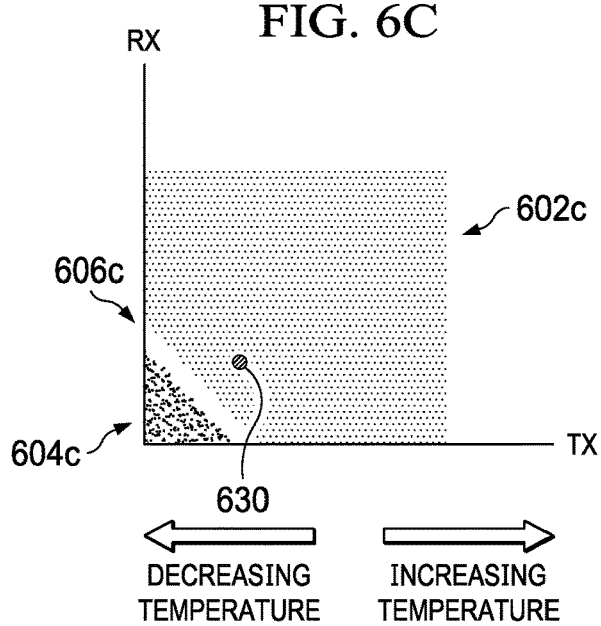

FIGS. 6A-6C show plots indicating the effect of SoC die operating temperature on passing and failing read transaction regions in accordance with various examples. FIG. 6A shows passing regions 602a and 604a and failing read region 606a at an intermediate SoC die operating temperature. A tuning point 630 for the SPI 110 comprising an RD cycle value of n might be chosen for successful operation at the die temperature of FIG. 6A.

FIG. 6B shows passing regions 602b and 604b and failing read region 606b at a lower SoC die operating temperature. It can be seen that the failing read region 606b is now higher and to the right of the failing read region 606a. The tuning point 630 is still successful because it is still in the region 604b.

However, FIG. 6C shows passing regions 602c and 604c and failing read region 606c at a higher SoC die operating temperature. It can be seen that the failing read region 606c is now lower and to the left of the failing read region 606a. The tuning point 630 is no longer successful because it is now in the region 602c, where an RD cycle value of n+1 results in successful operation.

The boundary (or failing read region) between the two passing regions moves with a change in die temperature. If the boundary shifts during operation and crosses over the selected tuning point, subsequent reads by the SPI 110 will fail to read correct data because the data lines 202 are being sampled within the wrong cycle of the reference clock 206. FIGS. 6A-6C show an example of a poorly placed tuning point 630. FIG. 6B shows tuning at lower SoC die temperature. As die temperature increases, actual TX and RX delay values increase, causing the round trip delay to increase. However, the programmed TX, RX, and RD values in the SPI 110 remain the same, resulting in, at higher temperatures, the tuning point 630 being in the wrong RD cycle. To account for this, the tuning point selection method described herein identifies the largest passing region, and selects a TX, RX, and RD combination that is farther away from the moving boundary between RD cycle values.

Figure 7:
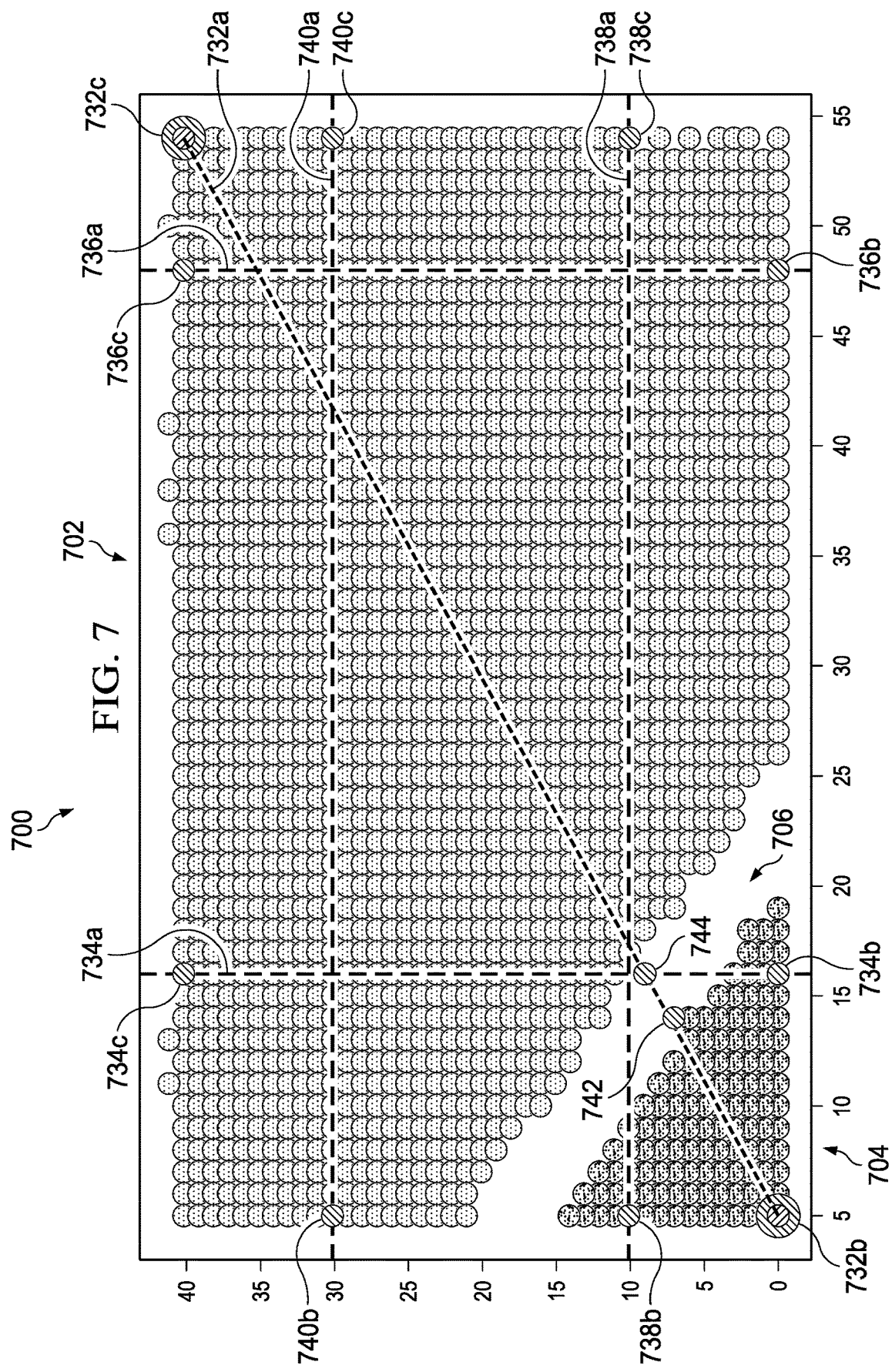
FIG. 7 shows a plot illustrating a tuning point selection method for selecting a preferred tuning point for an SPI in accordance with various examples.

FIG. 7 shows a plot 700 illustrating a tuning point selection method for selecting a preferred tuning point for the SPI 110 in accordance with various examples. Tuning points in a region 702 have a first value of the RD cycle and tuning points in a region 704 have a second value of the RD cycle. There are no successful tuning points in a failing read region 706.

The tuning point selection method described herein does not test all the combinations of TX, RX, and RD values shown in the plot 700. As explained in greater detail below, the tuning point selection method described herein samples only a subset of the combinations of TX, RX, and RD values to more quickly determine a preferred tuning point for the SPI 110.

Prior to initiating the tuning point selection method described herein, test data is written to the DDR flash memory 120. For this write process, the test data may be written to the DDR flash memory 120 in single data rate (SDR) mode, to ensure successful writing of the test data. In some examples, the size of the test data is 128 bytes, regardless of whether the SPI 110 is an OSPI or a QSPI. As described above, a DDR read transaction of the test data is considered successful only if the data read from the DDR flash memory 120 is an exact match for the test data.

In a first step, the method seeks to find the largest and smallest successful values of RX and the largest and smallest successful values of TX. This establishes a successful tuning point 732b bottom left (BL) corner of the plot 700 and a successful tuning point 732c at a top right (TR) corner of the plot 700. In the plot 700, the successful tuning point 732b has a first RD cycle value and the successful tuning point 732c has a second value of RD cycle. In a second step, the method searches tuning points between the successful tuning points 732b and 732c to find an unsuccessful tuning point 742 that is closest to the successful tuning point 732b and an unsuccessful tuning point 744 that is closest to the successful tuning point 732c. The unsuccessful tuning points 742 and 744 are found by performing a plurality of test read transactions with the DDR flash memory 120 at each of the first and second values of RD cycle and comparing the results of the plurality of test read transactions.

In a third step, the method selects which of the successful tuning points 732b and 732c is usable by the SPI 110 to read successfully from the DDR flash memory 120 over a larger range of operating temperatures by determining whether the successful tuning point 732b or 732c is farther from the unsuccessful tuning points 742 and 744. The determination is made by comparing the successful tuning points 732b and 732c to the unsuccessful tuning points 742 and 744. In a final step, the method programs the SPI 110 using the values of TX, RX, and RD of the selected one of successful tuning points 732b and 732c.

The method performs two searches to determine the largest and smallest successful values of RX. In a first search, the SPI 110 is set to a first search value of TX delay (represented by line 734a), and first test read transactions from the DDR flash memory 120 are performed with the SPI 110 set to different values of RX delay and RD cycle. Results of the first test read transactions are compared and smallest and largest successful tuning point 734b and 734c, respectively, are found for the first search value of TX delay. In a second search, the SPI 110 is set to a second search value of TX delay (represented by line 736a), and second test read transactions are performed at different values of RX delay and RD cycle. Results of the second test read transactions are compared and smallest and largest successful tuning point 736b and 736c, respectively, are found for the second search value of TX delay. The largest successful value of RX is set to the larger value of RX of the tuning points 734c and 736c. The smallest successful value of RX is set to the smaller value of RX of the tuning points 734b and 736b.

In some examples, the first and second search values of TX delay are selected as approximately ¼ and ¾ of a range of expected successful values of TX delay. In other examples, other first and second search values of TX delay may be selected. In various examples, the searches are performed according to a search criterion. For example, in some examples, the first and second searches are exhaustive linear searches of all values of RX delay and RD cycle for the first and second search values of TX delay. In other examples, an interval search such as, for example, a binary search is used to speed execution of the method.

Similarly, the method performs two searches to determine the largest and smallest successful values of TX. In a third search, the SPI 110 is set to a first search value of RX delay (represented by line 738a), and third test read transactions from the DDR flash memory 120 are performed with the SPI 110 set to different values of TX delay and RD cycle. Results of the third test read transactions are compared and smallest and largest successful tuning point 738b and 738c, respectively, are found for the first search value of RX delay. In a fourth search, the SPI 110 is set to a second search value of RX delay (represented by line 740a), and fourth test read transactions are performed at different values of TX delay and RD cycle. Results of the fourth test read transactions are compared and smallest and largest successful tuning point 740b and 740c, respectively, are found for the second search value of RX delay. The largest successful value of TX is set to the larger value of TX of the tuning points 738c and 740c. The smallest successful value of TX is set to the smaller value of TX of the tuning points 738b and 740b.

In some examples, the first and second search values of RX delay are selected as approximately ¼ and ¾ of the range between the largest and smallest successful values of RX determined in the first and second searches. In other examples, other first and second search values of RX delay may be selected. As for the first and second searches, in some examples, the third and fourth searches may be exhaustive linear searches of all values of TX delay and RD cycle for the first and second search values of RX delay, while in other examples, an interval search may be used.

After the largest and smallest successful values of TX delay and RX delay have been found, the successful tuning points 732b and 732c are identified, as described above. Tuning points lying along the line 732a connecting the successful tuning points 732b and 732c are searched in a fifth search to find the unsuccessful tuning points 742 and 744, as described above. As for the first through fourth searches, in various examples a binary search or interval search may be used to find the unsuccessful tuning points 742 and 744.

Figure 8:
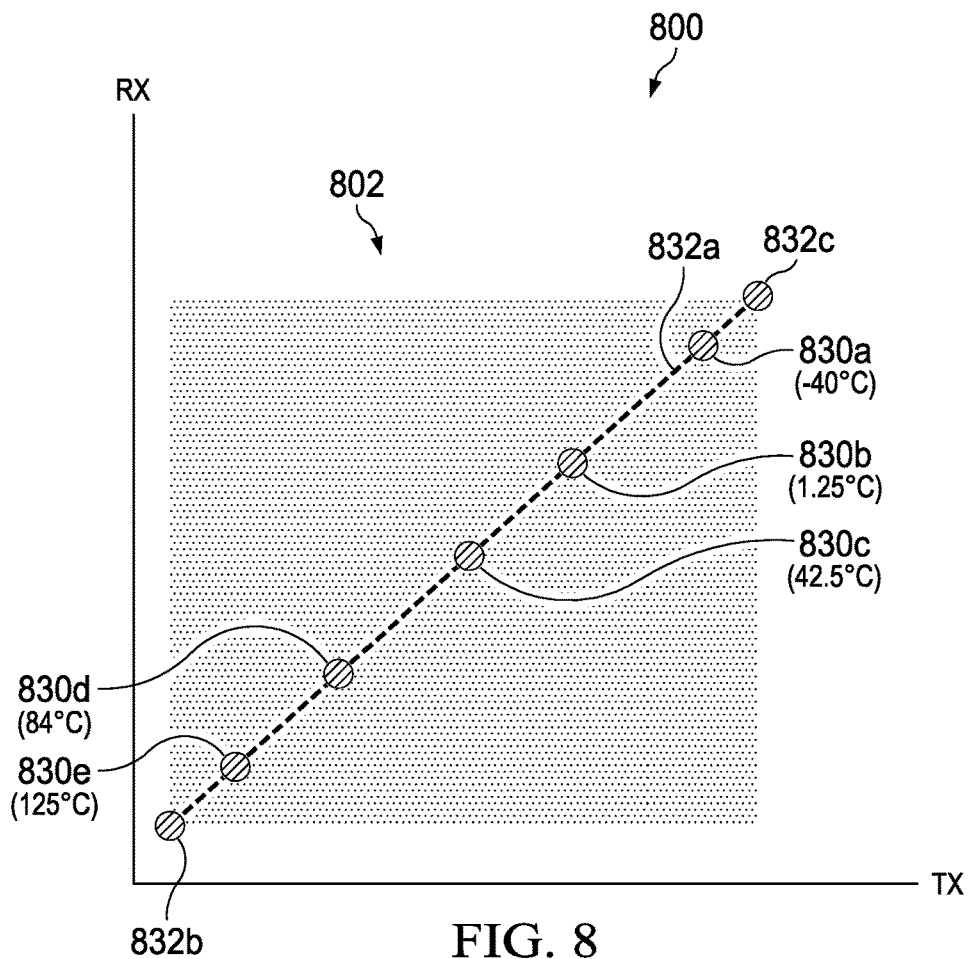
FIG. 8 shows a plot of preferred tuning points for an SPI according to expected operating temperature of the SoC die for a single passing read transaction region in accordance with various examples.

FIG. 8 shows a plot 800 of preferred tuning points for an SPI according to an expected operating temperature of the SoC die for a single passing read transaction region in accordance with various examples. Successful tuning points 840b and 840c are identified, as described above with reference to FIG. 7. Based on a determination that the RD cycle value for the successful tuning point 840b is equal to the value of the RD cycle for the successful tuning point 840c (that is, that both successful tuning points 840b and 840c are in a single successful region 802), a tuning point on the line 840a is selected based on an expected operating temperature of the SoC die. For lower expected operating temperatures, a tuning point closer to the successful tuning point 840c is selected. For higher expected operating temperatures, a tuning point closer to the successful tuning point 840b is selected. Example tuning points 830a-830e and associated operating temperatures are shown in FIG. 8 but are only provided to illustrate one of various examples.

FIGS. 9A and 9B show a flow chart of a first method 900 for selecting a preferred tuning point for an SPI in accordance with various examples. The method 900 includes steps of the method described with reference to FIG. 7.

The method 900 begins at step 902, where largest and smallest successful values of a receive clock delay are determined by determining first largest and smallest successful values of the receive clock delay at a first value of a transmit clock delay and determining second largest and smallest successful values of the receive clock delay at a second value of the transmit clock delay. In step 904, a final largest value of the receive clock delay is set to the larger of the first and second largest values of the receive clock delay and the final smallest value of the receive clock delay is set to the smaller of the first and second smallest values of the receive clock delay.

In step 906, largest and smallest successful values of a transmit clock delay are determined by determining first largest and smallest successful values of the transmit clock delay at a first value of a receive clock delay and determining second largest and smallest successful values of the transmit clock delay at a second value of the receive clock delay. In step 908, a final largest value of the transmit clock delay is set to the larger of the first and second largest values of the transmit clock delay and the final smallest value of the transmit clock delay is set to the smaller of the first and second smallest values of the transmit clock delay.

In step 910, a bottom left (BL) tuning point (e.g., the successful tuning point 732b in FIG. 7) is set to a combination of the final smallest value of the receive clock delay and the final smallest value of the transmit clock delay and a top right (TR) tuning point (e.g., the successful tuning point 732c in FIG. 7) is set to a combination of the final largest value of the receive clock delay and the final largest value of the transmit clock delay. In step 912, a lowest successful value for the RD cycle is found for each of the BL and TR tuning points. In some examples, such RD cycle values are inferred from the RD cycle values of the largest and smallest successful values of the receive clock delay and the largest and smallest successful values of the transmit clock delay found in steps 902 and 904, respectively. In other examples, the lowest successful values of the RD cycle are determined by performing test read transactions at the BL and TR tuning points using different candidate values for the RD cycle and comparing the results of the test read transactions.

Step 914 tests for the possibility that, due to the operating temperature of the SoC die under test, a failing read region (e.g., the region 706 of FIG. 7) includes one or the other of the BL and TR tuning points. If step 914 determines that no successful value of the RD cycle was found for one of the BL and TR tuning points, then in step 916 the method programs the SPI 110 to the TX, RX, and RD values of the one of the BL and TR tuning points with a successful RD cycle value.

If step 914 determines that both the BL and TR tuning points are successful tuning points, step 918 tests for the situation shown in FIG. 8, where both the BL and TR tuning points are in a single successful region (e.g., region 802). If step 918 determines that both the BL and TR tuning points have the same RD cycle value, then in step 920 the method programs the SPI 110 to a tuning point having that RD cycle value and values of TX and RX between the BL and TR tuning points, the values of TX and RX chosen based on an expected operating temperature of the SoC die.

If step 918 determines that the BL and TR tuning points have different RD cycle values, then in step 922 the method searches from the BL tuning point toward the TR tuning point to find a first unsuccessful tuning point that is closest to the BL tuning point on a line between the BL and TR tuning points (e.g., the unsuccessful tuning point 742 in FIG. 7). In step 924, the method searches from the TR tuning point toward the BL tuning point to find a second unsuccessful tuning point that is closest to the TR tuning point on a line between the BL and TR tuning points (e.g., the unsuccessful tuning point 744 in FIG. 7). In step 928, the method compares the first and second unsuccessful tuning points found in steps 922 and 924 to the BL and TR tuning points to determine which tuning point is in the larger passing region (e.g., region 702 in FIG. 7). The method selects one of the BL and TR tuning points based on the determination and programs the SPI 110 to the selected tuning point.

Figure 10:
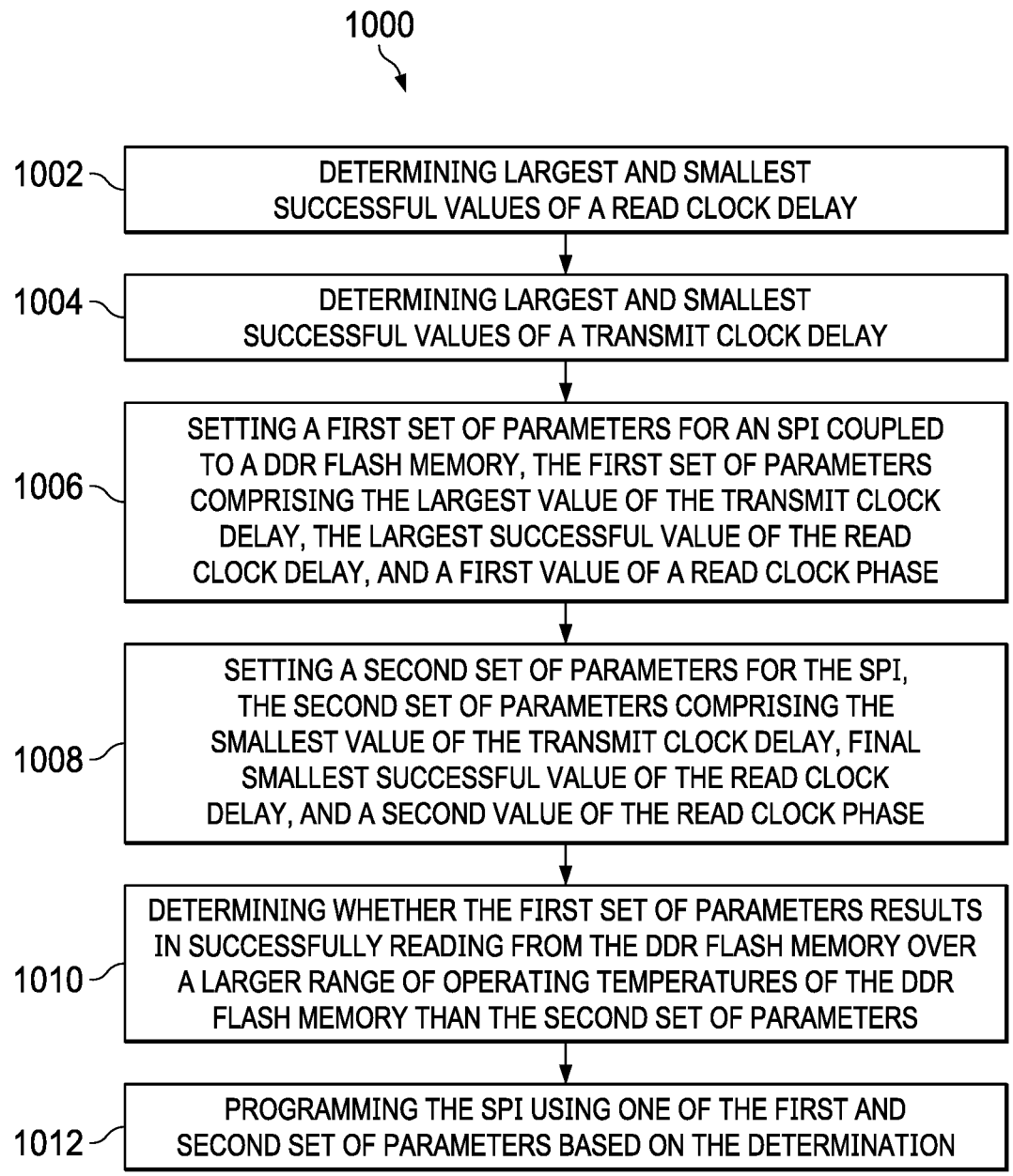
FIG. 10 shows a flow chart of a second method for selecting a preferred tuning point for an SPI in accordance with various examples.

FIG. 10 shows a flow diagram of a second method 1000 for selecting a preferred tuning point for an SPI in accordance with various examples. The hardware components described above with respect to FIG. 1 may perform method 1000 in one example, such as core processor 102. The method 1000 includes steps described for the methods 700 and 900 above.

The method 1000 begins at step 1002, where the core processor 102 determines largest and smallest successful values of a receive clock delay. In step 1004, the core processor 102 determines largest and smallest successful values of a transmit clock delay.

In step 1006, the core processor 102 sets a first set of parameters for an SPI coupled to a DDR flash memory, the first set of parameters comprising the largest value of the transmit clock delay, the largest successful value of the receive clock delay, and a first value of a read clock phase. In step 1008, the core processor 102 sets a second set of parameters for the SPI, the second set of parameters comprising the smallest value of the transmit clock delay, final smallest successful value of the receive clock delay, and a second value of the read clock phase.

In step 1010, the core processor 102 determines whether the first set of parameters results in successfully reading from the DDR flash memory over a larger range of operating temperatures of the DDR flash memory than the second set of parameters. In step 1012, the core processor 102 programs SPI using one of the first and second set of parameters based on the determination.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Unless otherwise stated, "about," "approximately," or "substantially" preceding a value means +/−10 percent of the stated value. Modifications are possible in the described examples, and other examples are possible within the scope of the claims.

What is claimed is:

1. A device, comprising:
   a memory storing instructions; and
   a processor adapted to be coupled to a Double Data Rate (DDR) flash memory by way of a Serial Peripheral Interface (SPI), the processor configured to execute the instructions stored in the memory to:
      determine a largest successful value and a smallest successful value of a transmit clock delay based on a comparison of results of a plurality of read transactions with the DDR flash memory, each read transaction performed at one of a first value and a second value of a reference clock delay (RD) cycle, a selected value of a receive clock delay, and a test value of the transmit clock delay, wherein the selected value of the receive clock delay is a same value in each of the plurality of read transactions and the test value of the transmit clock delay is a different value in each of the plurality of read transactions;
      determine a first set of parameters for the SPI that is usable by the processor to read successfully from the DDR flash memory, the first set of parameters comprising the largest successful value of the transmit clock delay, a largest successful value of a receive clock delay, and the first value of the RD cycle;
      determine a second set of parameters for the SPI that is usable by the processor to read successfully from the DDR flash memory, the second set of parameters comprising the smallest successful value of the transmit clock delay, a smallest successful value of the receive clock delay, and the second value of the RD cycle;
      select one of the first and second sets of parameters based on a determination of whether the first set of parameters is usable by the processor to read successfully from the DDR flash memory over a larger range of operating temperatures of the device than the second set of parameters; and
      program the SPI using the selected one of the first and second sets of parameters.

2. The device of claim 1, wherein the processor is configured to execute the instructions stored in the memory to:
   select a plurality of different test values of the transmit clock delay according to a search criterion.

3. The device of claim 1, wherein the processor is configured to execute the instructions stored in the memory to:
   determine the largest and smallest successful values of the receive clock delay based on a comparison of results of a plurality of read transactions with the DDR flash memory, each read transaction performed at one of the first and second values of the RD cycle, a selected value of the transmit clock delay, and a test value of the receive clock delay, wherein the selected value of the transmit clock delay is the same value in each of the plurality of read transactions and the test value of the receive clock delay is a different value in each of the plurality of read transactions.

4. The device of claim 3, wherein the processor is configured to execute the instructions stored in the memory to:
   select a plurality of test values of the receive clock delay according to a search criterion.

5. The device of claim 1, wherein the processor is configured to execute the instructions stored in the memory to, based on a determination that the first value of the RD cycle is not equal to the second value of the RD cycle, determine an unsuccessful set of parameters that, when used by the processor, causes the SPI not to read successfully from the DDR flash memory, the unsuccessful set of parameters comprising:
   one of the first value of the RD cycle and the second value of the RD cycle;
   an unsuccessful value of the transmit clock delay between the smallest successful value of the transmit clock delay and the largest successful value of the transmit clock delay; and
   an unsuccessful value of the receive clock delay between the smallest successful value of the receive clock delay and the largest successful value of the receive clock delay.

6. The device of claim 1, wherein the processor is configured to execute the instructions stored in the memory to, based on a determination that the first value of the RD cycle is equal to the second value of the RD cycle:
   program the SPI to the first value of the RD cycle; and
   program the SPI to a selected value of the transmit clock delay between the smallest successful value of the transmit clock delay and the largest successful value of the transmit clock delay, and a selected value of the receive clock delay between the smallest successful value of the receive clock delay and the largest successful value of the receive clock delay, wherein the selected value of the transmit clock delay and the selected value of the receive clock delay are selected based on an expected operating temperature of the device.

7. A device, comprising:
a memory storing instructions; and
a processor adapted to be coupled to a Double Data Rate (DDR) flash memory by way of a Serial Peripheral Interface (SPI), the processor configured to execute the instructions stored in the memory to:
  determine a first set of parameters for the SPI that is usable by the processor to read successfully from the DDR flash memory, the first set of parameters comprising a largest successful value of a transmit clock delay, a largest successful value of a receive clock delay, and a first value of a reference clock delay (RD) cycle;
  determine a second set of parameters for the SPI that is usable by the processor to read successfully from the DDR flash memory, the second set of parameters comprising a smallest successful value of the transmit clock delay, a smallest successful value of the receive clock delay, and a second value of the RD cycle;
  based on a determination that the first value of the RD cycle is not equal to the second value of the RD cycle, determine an unsuccessful set of parameters that, when used by the processor, causes the SPI not to read successfully from the DDR flash memory, the unsuccessful set of parameters comprising:
    one of the first value of the RD cycle and the second value of the RD cycle;
    an unsuccessful value of the transmit clock delay between the smallest successful value of the transmit clock delay and the largest successful value of the transmit clock delay; and
    an unsuccessful value of the receive clock delay between the smallest successful value of the receive clock delay and the largest successful value of the receive clock delay;
  determine whether the first set of parameters are usable by the processor to read successfully from the DDR flash memory over a larger range of operating temperatures of the device than the second set of parameters based on a comparison of the unsuccessful set of parameters to the first set of parameters and to the second set of parameters;
  select one of the first and second sets of parameters based on the determination of whether the first set of parameters is usable by the processor to read successfully from the DDR flash memory over a larger range of operating temperatures of the device than the second set of parameters; and
  program the SPI using the selected one of the first and second sets of parameters.

8. The device of claim 7, wherein the processor is configured to execute the instructions stored in the memory to:
  determine the unsuccessful set of parameters based on a comparison of results of a plurality of read transactions with the DDR flash memory, each read transaction performed at one of successful values of the RD cycle and selected values of the transmit clock delay and the receive clock delay,
  wherein the selected values of the transmit clock delay and the receive clock delay are different values in each of the plurality of read transactions and the selected values lie along a line between the values of the transmit clock delay and the receive clock delay of the first set of parameters and the values of the transmit clock delay and the receive clock delay of the second set of parameters.

9. A device, comprising:
a memory storing instructions; and
a processor adapted to be coupled to a Double Data Rate (DDR) flash memory by way of a Serial Peripheral Interface (SPI), the processor configured to execute the instructions stored in the memory to:
  determine a first set of parameters for the SPI that is usable by the processor to read successfully from the DDR flash memory, the first set of parameters comprising a largest successful value of a transmit clock delay, a largest successful value of a receive clock delay, and a first value of a reference clock delay (RD) cycle;
  determine a second set of parameters for the SPI that is usable by the processor to read successfully from the DDR flash memory, the second set of parameters comprising a smallest successful value of the transmit clock delay, a smallest successful value of the receive clock delay, and a second value of the RD cycle;
  select one of the first and second sets of parameters based on a determination of whether the first set of parameters is usable by the processor to read successfully from the DDR flash memory over a larger range of operating temperatures of the device than the second set of parameters;
  program the SPI using the selected one of the first and second sets of parameters;
  based on a determination that the first value of the RD cycle is equal to the second value of the RD cycle:
    program the SPI to the first value of the RD cycle; and
    program the SPI to a selected value of the transmit clock delay between the smallest successful value of the transmit clock delay and the largest successful value of the transmit clock delay, and a selected value of the receive clock delay between the smallest successful value of the receive clock delay and the largest successful value of the receive clock delay,
    wherein the selected value of the transmit clock delay and the selected value of the receive clock delay are selected based on an expected operating temperature of the device.

10. A device, comprising:
a memory storing instructions; and
a processor adapted to be coupled to a Double Data Rate (DDR) flash memory by way of a Serial Peripheral Interface (SPI), the processor configured to execute the instructions stored in the memory to:
  determine a first value of a reference clock delay (RD) cycle based on a comparison of results of a plurality of read transactions with the DDR flash memory, each read transaction performed using values of a transmit clock delay and a receive clock delay of one set of parameters and a test value of the RD cycle, wherein the test value of the RD cycle is a different value in each of the plurality of read transactions and the first value of the RD cycle is set to a smallest value of the RD cycle that results in a successful read transaction with the DDR flash memory;
determine a second value of the RD cycle based on a comparison of results of a plurality of read transactions with the DDR flash memory, each read transaction performed using values of the transmit clock delay and the receive clock delay of another set of parameters and a test value of the RD cycle, wherein the test value of the RD cycle is a different value in each of the plurality of read transactions and the second value of the RD cycle is set to the smallest value of the RD cycle that results in a successful read transaction with the DDR flash memory;
determine final largest and smallest successful values of a receive clock delay by:
determining first largest and smallest successful values of a receive clock delay at the first value of the transmit clock delay and determining second largest and smallest successful values of the receive clock delay at the second value of the transmit clock delay; and
setting the final largest successful value of the receive clock delay to a larger of the first and second largest values of the receive clock delay and setting the final smallest successful value of the receive clock delay to a smaller of the first and second smallest values of the receive clock delay;
determine final largest and smallest successful values of the transmit clock delay by:
determining first largest and smallest successful values of the transmit clock delay at a first value of the receive clock delay and determining second largest and smallest successful values of the transmit clock delay at a second value of the receive clock delay; and
setting the final largest successful value of the transmit clock delay to a larger of the first and second largest values of the transmit clock delay and setting the final smallest successful value of the transmit clock delay to a smaller of the first and second smallest values of the transmit clock delay;
set a first set of parameters for the SPI, the first set of parameters comprising the final largest value of the transmit clock delay, the final largest successful value of the receive clock delay, and a first value of the RD cycle;
set a second set of parameters for the SPI, the second set of parameters comprising the final smallest value of the transmit clock delay, the final smallest successful value of the receive clock delay, and a second value of the RD cycle;
select one of the first and second sets of parameters based on a determination of whether the first set of parameters is usable by the processor to read successfully from the DDR flash memory over a larger range of operating temperatures of the device than the second set of parameters; and
program the SPI using the selected one of the first and second sets of parameters.

11. The device of claim 10, wherein based on a determination that no value of the RD cycle results in a successful read transaction with the DDR flash memory for the values of the transmit clock delay and the receive clock delay of one of the first set of parameters and the second set of parameters, the SPI is programmed using the other one of the first set of parameters and the second set of parameters.

12. A device, comprising:
a memory storing instructions; and
a processor adapted to be coupled to a Double Data Rate (DDR) flash memory by way of a Serial Peripheral Interface (SPI), the processor configured to execute the instructions stored in the memory to:
determine final largest and smallest successful values of a receive clock delay by:
determining first largest and smallest successful values of a receive clock delay at a first value of a transmit clock delay and determining second largest and smallest successful values of the receive clock delay at a second value of the transmit clock delay; and
setting the final largest successful value of the receive clock delay to a larger of the first and second largest values of the receive clock delay and setting the final smallest successful value of the receive clock delay to a smaller of the first and second smallest values of the receive clock delay;
determine final largest and smallest successful values of the transmit clock delay by:
determining first largest and smallest successful values of the transmit clock delay at a first value of the receive clock delay and determining second largest and smallest successful values of the transmit clock delay at a second value of the receive clock delay; and
setting the final largest successful value of the transmit clock delay to a larger of the first and second largest values of the transmit clock delay and setting the final smallest successful value of the transmit clock delay to a smaller of the first and second smallest values of the transmit clock delay;
set a first set of parameters for the SPI, the first set of parameters comprising the final largest value of the transmit clock delay, the final largest successful value of the receive clock delay, and a first value of a reference clock delay (RD) cycle;
set a second set of parameters for the SPI, the second set of parameters comprising the final smallest value of the transmit clock delay, the final smallest successful value of the receive clock delay, and a second value of the RD cycle;
based on a determination that the first value of the RD cycle is not equal to the second value of the RD cycle, determine an unsuccessful set of parameters that, when used by the processor, causes the SPI not to read successfully from the DDR flash memory, the unsuccessful set of parameters comprising:
one of the first value of the RD cycle and the second value of the RD cycle;
an unsuccessful value of the transmit clock delay between the final smallest successful value of the transmit clock delay and the final largest successful value of the transmit clock delay; and
an unsuccessful value of the receive clock delay between the final smallest successful value of the receive clock delay and the final largest successful value of the receive clock delay;
determine whether the first set of parameters are usable by the processor to read successfully from the DDR flash memory over a larger range of operating temperatures of the device than the second set of parameters based on a comparison of the unsuccessful set of parameters to the first set of parameters and to the second set of parameters;

select one of the first and second sets of parameters based on the determination of whether the first set of parameters is usable by the processor to read successfully from the DDR flash memory over a larger range of operating temperatures of the device than the second set of parameters; and program the SPI using the selected one of the first and second sets of parameters.

13. A device, comprising:

a memory storing instructions; and a processor adapted to be coupled to a Double Data Rate (DDR) flash memory by way of a Serial Peripheral Interface (SPI), the processor configured to execute the instructions stored in the memory to:

determine final largest and smallest successful values of a receive clock delay by:

determining first largest and smallest successful values of a receive clock delay at a first value of a transmit clock delay and determining second largest and smallest successful values of the receive clock delay at a second value of the transmit clock delay; and setting the final largest successful value of the receive clock delay to a larger of the first and second largest values of the receive clock delay and setting the final smallest successful value of the receive clock delay to a smaller of the first and second smallest values of the receive clock delay;

determine final largest and smallest successful values of the transmit clock delay by:

determining first largest and smallest successful values of the transmit clock delay at a first value of the receive clock delay and determining second largest and smallest successful values of the transmit clock delay at a second value of the receive clock delay; and setting the final largest successful value of the transmit clock delay to a larger of the first and second largest values of the transmit clock delay and setting the final smallest successful value of the transmit clock delay to a smaller of the first and second smallest values of the transmit clock delay;

set a first set of parameters for the SPI, the first set of parameters comprising the final largest value of the transmit clock delay, the final largest successful value of the receive clock delay, and a first value of a reference clock delay (RD) cycle;

set a second set of parameters for the SPI, the second set of parameters comprising the final smallest value of the transmit clock delay, the final smallest successful value of the receive clock delay, and a second value of the RD cycle;

select one of the first and second sets of parameters based on a determination of whether the first set of parameters is usable by the processor to read successfully from the DDR flash memory over a larger range of operating temperatures of the device than the second set of parameters;

program the SPI using the selected one of the first and second sets of parameters;

based on a determination that the first value of the RD cycle is equal to the second value of the RD cycle:

program the SPI to the first value of the RD cycle; and program the SPI to a selected value of the transmit clock delay between the final smallest successful value of the transmit clock delay and the final largest successful value of the transmit clock delay, and a selected value of the receive clock delay between the final smallest successful value of the receive clock delay and the final largest successful value of the receive clock delay, wherein the selected value of the transmit clock delay and the selected value of the receive clock delay are selected based on an expected operating temperature of the device.

14. A method comprising:

determining a first value of a reference clock delay (RD) cycle based on a comparison of results of a plurality of read transactions with a Double Data Rate (DDR) flash memory, each read transaction performed using values of a transmit clock delay and a receive clock delay of one set of parameters and a test value of the RD cycle, wherein the test value of the RD cycle is a different value in each of the plurality of read transactions and the first value of the RD cycle is set to a smallest value of the RD cycle that results in a successful read transaction with the DDR flash memory;

determining a second value of the RD cycle based on a comparison of results of a plurality of read transactions with the DDR flash memory, each read transaction performed using the values of the transmit clock delay and the receive clock delay of another set of parameters and a test value of the RD cycle, wherein the test value of the RD cycle is a different value in each of the plurality of read transactions and the second value of the RD cycle is set to the smallest value of the RD cycle that results in a successful read transaction with the DDR flash memory determining largest and smallest successful values of the receive clock delay;

determining largest and smallest successful values of the transmit clock delay;

setting a first set of parameters for a Serial Peripheral Interface (SPI) coupled to the DDR flash memory, the first set of parameters comprising the largest successful value of the transmit clock delay, the largest successful value of the receive clock delay, and a first value of the RD cycle;

setting a second set of parameters for the SPI, the second set of parameters comprising the smallest successful value of the transmit clock delay, the smallest successful value of the receive clock delay, and a second value of the RD cycle;

selecting one of the first and second sets of parameters based on determining whether the first set of parameters results in successfully reading from the DDR flash memory over a larger range of operating temperatures of a device performing the method than the second set of parameters; and programming the SPI using the selected one of the first and second sets of parameters.

15. The method of claim 14, wherein:

the largest and smallest successful values of the receive clock delay are final largest and smallest successful values of the receive clock delay and determining the final largest and smallest successful values of the receive clock delay comprise:

determining first largest and smallest successful values of the receive clock delay at a first value of a transmit clock delay and determining second largest and smallest successful values of the receive clock delay at a second value of the transmit clock delay; and setting the final largest value of the receive clock delay to a larger of the first and second largest values of the receive clock delay and setting the final smallest value of the receive clock delay to a smaller of the first and second smallest values of the receive clock delay; and the largest and smallest successful values of the transmit clock delay are final largest and smallest successful values of the transmit clock delay and determining the final largest and smallest successful values of the transmit clock delay comprise:

determining first largest and smallest successful values of the transmit clock delay at a first value of a receive clock delay and determining second largest and smallest successful values of the transmit clock delay at a second value of the receive clock delay; and setting the final largest value of the transmit clock delay to a larger of the first and second largest values of the transmit clock delay and setting the final smallest value of the transmit clock delay to a smaller of the first and second smallest values of the transmit clock delay.

16. The method of claim 14, further comprising:

determining that no value of the RD cycle results in a successful read transaction with the DDR flash memory for the values of the transmit clock delay and the receive clock delay of one of the first set of parameters and the second set of parameters; and programming the SPI using the other one of the first and second sets of parameters based on the determination.

17. A method, comprising:

determining largest and smallest successful values of a receive clock delay;

determining largest and smallest successful values of a transmit clock delay;

setting a first set of parameters for a Serial Peripheral Interface (SPI) coupled to a Double Data Rate (DDR) flash memory, the first set of parameters comprising the largest successful value of the transmit clock delay, the largest successful value of the receive clock delay, and a first value of a reference clock delay (RD) cycle;

setting a second set of parameters for the SPI, the second set of parameters comprising the smallest successful value of the transmit clock delay, the smallest successful value of the receive clock delay, and a second value of the RD cycle;

in response to determining that the first value of the RD cycle is not equal to the second value of the RD cycle, determining an unsuccessful set of parameters for the SPI that does not successfully read from the DDR flash memory, the unsuccessful set of parameters comprising:

one of the first value of the RD cycle and the second value of the RD cycle;

an unsuccessful value of the transmit clock delay between the smallest successful value of the transmit clock delay and the largest successful value of the transmit clock delay; and an unsuccessful value of the receive clock delay between the smallest successful value of the receive clock delay and the largest successful value of the receive clock delay;

determining whether the first set of parameters results in successfully reading from the DDR flash memory over a larger range of operating temperatures of a device performing the method than the second set of parameters based on a comparison of the unsuccessful set of parameters to the first set of parameters and to the second set of parameters;

selecting one of the first and second sets of parameters based on determining whether the first set of parameters results in successfully reading from the DDR flash memory over a larger range of operating temperatures of the device performing the method than the second set of parameters; and programming the SPI using the selected one of the first and second sets of parameters.

18. The method of claim 17, wherein:

the largest and smallest successful values of the receive clock delay are final largest and smallest successful values of the receive clock delay and determining the final largest and smallest successful values of the receive clock delay comprise:

determining first largest and smallest successful values of the receive clock delay at a first value of a transmit clock delay and determining second largest and smallest successful values of the receive clock delay at a second value of the transmit clock delay; and setting the final largest value of the receive clock delay to a larger of the first and second largest values of the receive clock delay and setting the final smallest value of the receive clock delay to a smaller of the first and second smallest values of the receive clock delay; and the largest and smallest successful values of the transmit clock delay are final largest and smallest successful values of the transmit clock delay and determining the final largest and smallest successful values of the transmit clock delay comprise:

determining first largest and smallest successful values of the transmit clock delay at a first value of a receive clock delay and determining second largest and smallest successful values of the transmit clock delay at a second value of the receive clock delay; and setting the final largest value of the transmit clock delay to a larger of the first and second largest values of the transmit clock delay and setting the final smallest value of the transmit clock delay to a smaller of the first and second smallest values of the transmit clock delay.

19. A method, comprising:

determining largest and smallest successful values of a receive clock delay;

determining largest and smallest successful values of a transmit clock delay;

setting a first set of parameters for a Serial Peripheral Interface (SPI) coupled to a Double Data Rate (DDR) flash memory, the first set of parameters comprising the largest successful value of the transmit clock delay, the largest successful value of the receive clock delay, and a first value of a reference clock delay (RD) cycle;

setting a second set of parameters for the SPI, the second set of parameters comprising the smallest successful value of the transmit clock delay, the smallest successful value of the receive clock delay, and a second value of the RD cycle;

selecting one of the first and second sets of parameters based on determining whether the first set of parameters results in successfully reading from the DDR flash memory over a larger range of operating temperatures of a device performing the method than the second set of parameters;

programming the SPI using the selected one of the first and second sets of parameter;

in response to determining that the first value of the RD cycle is equal to the second value of the RD cycle:
  selecting a selected value of the transmit clock delay between the smallest successful value of the transmit clock delay and the largest successful value of the transmit clock delay and a selected value of the receive clock delay between the smallest successful value of the receive clock delay and the largest successful value of the receive clock delay, the selection based on an expected operating temperature of the device performing the method; and
  programming the SPI to the first value of the RD cycle, the selected value of the transmit clock delay, and the selected value of the receive clock delay.

20. The method of claim 19, wherein:

the largest and smallest successful values of the receive clock delay are final largest and smallest successful values of the receive clock delay and determining the final largest and smallest successful values of the receive clock delay comprise:
  determining first largest and smallest successful values of the receive clock delay at a first value of a transmit clock delay and determining second largest and smallest successful values of the receive clock delay at a second value of the transmit clock delay; and
  setting the final largest value of the receive clock delay to a larger of the first and second largest values of the receive clock delay and setting the final smallest value of the receive clock delay to a smaller of the first and second smallest values of the receive clock delay; and the largest and smallest successful values of the transmit clock delay are final largest and smallest successful values of the transmit clock delay and determining the final largest and smallest successful values of the transmit clock delay comprise:
  determining first largest and smallest successful values of the transmit clock delay at a first value of a receive clock delay and determining second largest and smallest successful values of the transmit clock delay at a second value of the receive clock delay; and
  setting the final largest value of the transmit clock delay to a larger of the first and second largest values of the transmit clock delay and setting the final smallest value of the transmit clock delay to a smaller of the first and second smallest values of the transmit clock delay.

* * * * *